(12) United States Patent
Lee et al.

(10) Patent No.: US 8,173,280 B2
(45) Date of Patent: May 8, 2012

(54) NICKEL OXIDE FILM FOR BOLOMETER AND METHOD FOR MANUFACTURING THEREOF, AND INFRARED DETECTOR USING THE SAME

(75) Inventors: Hee-Chul Lee, Daejeon (KR); Dong Soo Kim, Icheon (KR); Yong-Soo Lee, Daejeon (KR)

(73) Assignee: Korea Advanced Institute of Science and Technology (KR)

( * ) Notice: Subject to any disclaimer, the term of this patent is extended or adjusted under 35 U.S.C. 154(b) by 35 days.

(21) Appl. No.: 12/608,657

(22) Filed: Oct. 29, 2009

(65) Prior Publication Data

US 2010/0167037 A1 Jul. 1, 2010

(30) Foreign Application Priority Data

Dec. 29, 2008 (KR) ........................ 10-2008-0135149

(51) Int. Cl.
*C01G 53/04* (2006.01)
*C01B 33/20* (2006.01)
*B32B 15/00* (2006.01)
*B05D 3/02* (2006.01)

(52) U.S. Cl. ........ 428/701; 428/702; 428/220; 428/446; 505/161

(58) Field of Classification Search ........................ None
See application file for complete search history.

(56) References Cited

U.S. PATENT DOCUMENTS

| | | | | |
|---|---|---|---|---|
| 2,986,717 A * | 5/1961 | Miserocchi | ...................... | 338/17 |
| 3,019,404 A * | 1/1962 | Fastenau et al. | ................. | 338/28 |
| 3,061,476 A * | 10/1962 | Miserocchi | ..................... | 427/102 |
| 3,629,585 A * | 12/1971 | Desvignes et al. | ............. | 250/350 |
| 5,325,863 A * | 7/1994 | Pompei | ......................... | 600/549 |
| 5,445,158 A * | 8/1995 | Pompei | ......................... | 600/474 |
| 5,653,238 A * | 8/1997 | Pompei | ......................... | 600/474 |
| 6,037,590 A * | 3/2000 | Boreman et al. | ............ | 250/338.4 |
| 6,047,205 A * | 4/2000 | Pompei | ......................... | 600/474 |
| 6,219,573 B1 * | 4/2001 | Pompei | ......................... | 600/474 |
| 6,310,346 B1 * | 10/2001 | Boreman et al. | ............ | 250/338.4 |
| 6,688,731 B1 * | 2/2004 | Fujii et al. | ....................... | 347/68 |
| 6,880,234 B2 * | 4/2005 | Khan | .............................. | 29/620 |
| 7,145,141 B2 * | 12/2006 | Kim et al. | .................. | 250/338.1 |
| 7,744,947 B2 * | 6/2010 | Lee et al. | ....................... | 427/58 |
| 2005/0133721 A1 * | 6/2005 | Kim et al. | .................. | 250/338.1 |
| 2005/0186117 A1 * | 8/2005 | Uchiyama et al. | .............. | 422/91 |
| 2006/0062274 A1 * | 3/2006 | Pompei | ......................... | 374/121 |
| 2010/0323160 A1 * | 12/2010 | Nakahara et al. | .............. | 428/141 |

OTHER PUBLICATIONS

Fumeaux et al. Appl. Phys. B 66, 1998, 327-332.*
Fumeaux et. al. Infrared Physics and Technology 39, 1998, 123-183.*
Wilke et al. Appl. Phys. A 58,1994, 329-341.*
Wilke et al. Appl. Phys. B 58, 1994, 87-95.*
Umadevi et al. Sensors and Actuators. A 96, 2002 p. 114-124.*

* cited by examiner

*Primary Examiner* — Timothy Speer
*Assistant Examiner* — Vera Katz
(74) *Attorney, Agent, or Firm* — The Belles Group, P.C.

(57) ABSTRACT

There are provided a nickel oxide film for a bolometer and a manufacturing method thereof, and an infrared detector using the nickel oxide film. The nickel oxide film has properties with a TCR value greater than −3%/° C., a low noise value, and stable and high reproducibility properties. The nickel oxide film is applicable to manufacturing an infrared detector using a nickel oxide film for a bolometer.

3 Claims, 6 Drawing Sheets

NICKEL OXIDE FILM FOR BOLOMETER AND METHOD FOR MANUFACTURING THEREOF, AND INFRARED DETECTOR USING THE SAME

CROSS-REFERENCE TO RELATED APPLICATION

This application claims priority to Korean Patent Application No. 10-2008-0135149, filed Dec. 29, 2008, the entirety of which is hereby incorporated by reference.

BACKGROUND OF THE INVENTION

1. Field of the Invention

The present invention relates to a nickel oxide film for a bolometer and a method for manufacturing thereof, and an infrared detector using the nickel oxide film.

2. Description of the Related Art

A bolometer is a kind of an infrared detector. The bolometer may absorb incident infrared rays to cause a change in temperature, and then detect the incident infrared rays by measuring a change in electric resistance generated by the temperature change. There are a first method for changing a structure of the bolometer and a second method for improving properties of a bolometer material to improve a performance of the bolometer. In this case, the properties for the bolometer material required in the second method are a high temperature coefficient of resistance (TCR), a low 1/f noise, and an ohmic resistance with low contact resistance between a bolometer sensing material and a bolometer leg. Further, compatibility with an IC process, simplification of a process, low cost, and, stable electric characteristics and reproducibility should be satisfied.

The bolometer materials recently used are amorphous silicon, metal thin films, metal oxide films, etc. Titanium, nickel, nickel-iron, and the like are used as the metal thin films. The titanium has a small resistivity of 42 u$\Omega$-cm, a small TCR value of 0.4%/K, and a small 1/f noise value. The nickel has a resistivity of 6.93 u$\Omega$-cm and a TCR value of 0.68%/K. The metal thin film has a small resistivity, a small TCR value, and a small noise value. Such a small TCR value has a problem that it deteriorates the responsibility property of the bolometer.

Metal oxide films tend to have a relatively high TCR value and a relatively low noise value. Among them, a vanadium oxide film has a high TCR value around −2.0%/K, electrical resistance of 100 k$\Omega$, and a low 1/f noise value. However, the metal oxide films have problems in that it is difficult to fabricate them with high reproducibility due to the existence of materials being in metastable states, thereby making it difficult to change a resistance value and to obtain stable electric characteristics.

Furthermore, although the amorphous silicon has a TCR value around −2.0%/K and a resistivity greater than 100 $\Omega$-cm, it has a problem that it has a relatively higher noise value than that of other materials. In addition, the amorphous silicon and the vanadium oxide film have problems in that they use expensive equipment and a complicated process.

SUMMARY OF THE INVENTION

The present invention has been made in view of the above problems, and it is an object of the present invention to provide a nickel oxide film for a bolometer with a high TCR value and a low noise value manufactured by a simplified process and a method for manufacturing thereof, and an infrared detector using the nickel oxide film.

It is a second object of the present invention to provide a stable nickel oxide film for a bolometer with high reproducibility property and a method for manufacturing thereof, and an infrared detector using the nickel oxide film.

It is a third object of the present invention to provide a nickel oxide film for a bolometer capable of reducing manufacturing costs by manufacturing the nickel oxide film using cheap equipment and a simplified process, and a method for manufacturing thereof, and an infrared detector using the nickel oxide film.

It is a fourth object of the present invention to provide a nickel oxide film for a bolometer with high infrared sensitivity and a method for manufacturing thereof, and an infrared detector using the nickel oxide film.

In accordance with the present invention, there is provided a nickel oxide film for a bolometer comprising: at least one compound selected from the group consisting of $NiO_x$, $Ni_{1-y}O$, $Ni_2O_3$, $Ni(OH)_2$, $NiSiO_3$, and $NiSiO_4$, wherein x satisfies $1 \leq x \leq 20$, and y satisfies $0 \leq y \leq 0.95$.

In accordance with the present invention, there is provided a method for manufacturing a nickel oxide film for a bolometer comprising the steps of: (i) depositing nickel on a substrate; and (ii) performing a heat treatment for the substrate on which the nickel is deposited in an oxygen atmosphere for a predetermined time and forming a nickel oxide film, wherein the nickel oxide film includes at least one compound selected from the group consisting of $NiO_x$, $Ni_{1-y}O$, $Ni_2O_3$, $Ni(OH)_2$, $NiSiO_3$, and $NiSiO_4$, wherein x satisfies $1 \leq x \leq 20$, and y satisfies $0 \leq y \leq 0.95$.

Preferably, the nickel is deposited to have a thickness ranging from 10 nm to 200 nm in step (i).

Preferably, the nickel is deposited using one of a DC sputter, an RF sputter, an evaporator, and a metal-organic chemical vapor deposition (MOCVD) in step (i).

Preferably, the DC sputter and the RF sputter use argon (Ar) or nitrogen ($N_2$) plasma.

Preferably, a target of the DC sputter, a target of the RF sputter, and a target of the evaporator use the nickel (Ni).

Also, the nickel oxide film is made to have a thickness ranging from 20 nm to 300 nm in step (ii).

Further, a composition ratio of the nickel oxide film is controlled by changing a heat treatment time, a heat treatment temperature, and an oxygen partial pressure degree in step (ii).

Furthermore, the heat treatment is performed at a temperature ranging from 300° C. to 450° C. in step (ii).

In accordance with the present invention, there is provided a method for manufacturing a nickel oxide film for a bolometer comprising the steps of: (a) depositing a nickel oxide film on a substrate; and (b) performing a heat treatment for the substrate on which the nickel oxide film is deposited in a nitrogen or oxygen atmosphere for a predetermined time, wherein the nickel oxide film includes at least one compound selected from the group consisting of $NiO_x$, $Ni_{1-y}O$, $Ni_2O_3$, $Ni(OH)_2$, $NiSiO_3$, and $NiSiO_4$, wherein x satisfies $1 \leq x \leq 20$, and y satisfies $0 \leq y \leq 0.95$.

In accordance with the present invention, there is provided a method for manufacturing a nickel oxide film for a bolometer comprising the steps of (a) depositing a nickel oxide film on a substrate, wherein the nickel oxide film includes at least one compound selected from the group consisting of $NiO_x$, $Ni_{1-y}O$, $Ni_2O_3$, $Ni(OH)_2$, $NiSiO_3$, and $NiSiO_4$, wherein x satisfies $1 \leq x \leq 20$, and y satisfies $0 \leq y \leq 0.95$.

Preferably, the nickel oxide film is deposited to have a thickness ranging from 20 nm to 300 nm in step (a).

Preferably, the nickel oxide film is deposited using one of a DC sputter, an RF sputter, an evaporator, and a metal-organic chemical vapor deposition (MOCVD) in step (a).

Preferably, the DC sputter and the RF sputter use argon (Ar), oxygen ($O_2$), nitrogen ($N_2$) plasma, argon (Ar)-oxygen ($O_2$) mixing plasma, or oxygen ($O_2$)-nitrogen ($N_2$) mixing plasma.

Also, a target of the DC sputter, a target of the RF sputter, and a target of the evaporator use nickel (Ni) or the nickel oxide.

Further, a composition ratio of the nickel oxide film is controlled by changing power of the DC sputter, power of the RF sputter, process pressure, a ratio of used gases, and a substrate temperature in step (a).

A composition ratio of the nickel oxide film is controlled by changing a heat treatment time, a heat treatment temperature, and a nitrogen or oxygen atmosphere degree in step (b).

The heat treatment is performed at a temperature ranging from 50° C. to 450° C. in step (b).

In accordance with the present invention, there is provided an infrared detector comprising a bolometer, the bolometer including a nickel oxide film comprising: at least one compound selected from the group consisting of $NiO_x$, $Ni_2O_3$, $Ni(OH)_2$, $NiSiO_3$, and $NiSiO_1$, wherein x satisfies $1 \leq x \leq 20$, and y satisfies $0 \leq y \leq 0.95$.

Preferably, the nickel oxide film has a thickness ranging from 20 nm to 300 nm.

As described above, in the present invention, the nickel oxide film for a bolometer can be manufactured by a simplified process and can have a high TCR value and a low noise value.

Further, in the present invention, stable and high reproducibility properties can be obtained.

Moreover, in the present invention, since a nickel oxide film is manufactured using cheap equipment and a simplified process, manufacturing costs may be reduced.

In addition, in the present invention, high infrared sensitivity can be obtained.

Concrete details other than objects, means for solving the objects and effects are included in the following embodiments and drawings. Merits, features, and methods for achieving the present invention will be more apparent from the following detailed description in conjunction with the accompanying drawings. In the specification, the same reference numerals are used throughout the drawings to refer to the same or like parts.

BRIEF DESCRIPTION OF THE DRAWINGS

The objects, features and advantages of the present invention will be more apparent from the following detailed description in conjunction with the accompanying drawings, in which.

DETAILED DESCRIPTION OF EXEMPLARY EMBODIMENTS

Hereinafter, exemplary embodiments of the present invention are described in detail referring to the accompanying drawings. It will be understood by those skilled, in the art that the accompanying drawings have been illustrated for readily explaining the present invention and the present invention is not limited to the drawings.

Figure 1:
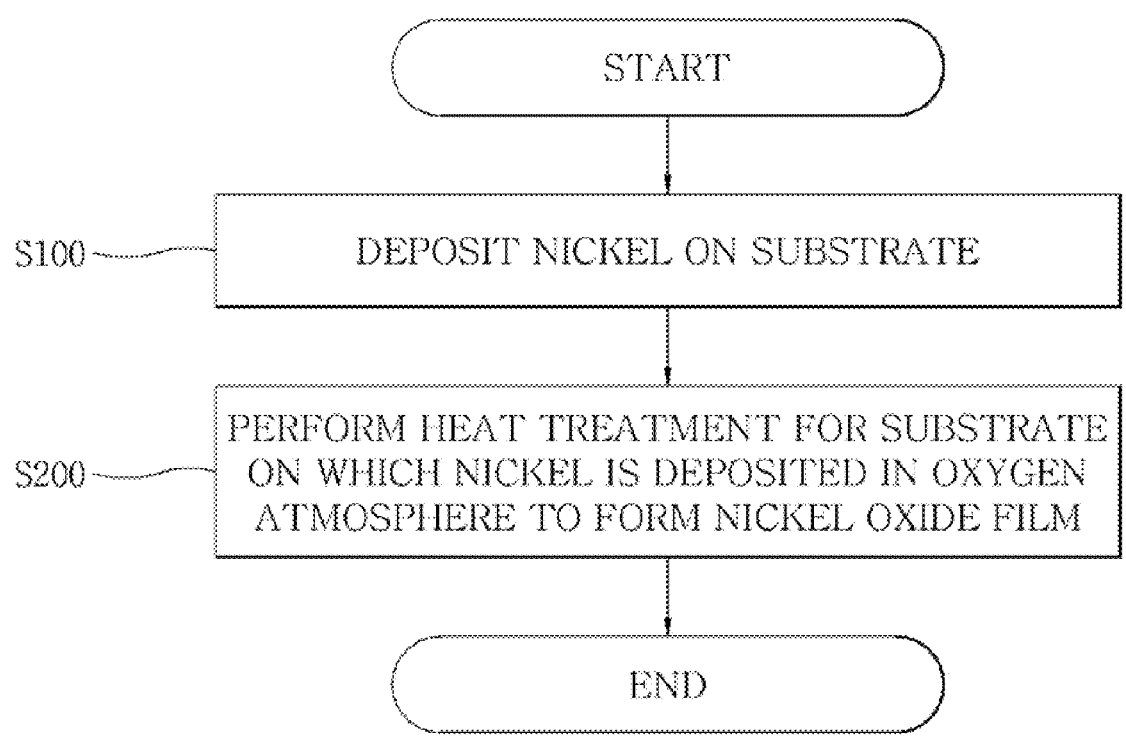
FIG. 1 is a flowchart illustrating a method for manufacturing a nickel oxide film for a bolometer in accordance with an embodiment of the present invention.

FIG. 1 is a flow chart illustrating a method for manufacturing a nickel oxide film for a bolometer in accordance with an embodiment of the present invention.

Referring to FIG. 1, the method for manufacturing a nickel oxide film for a bolometer in accordance with an embodiment of the present invention includes: a first step of depositing nickel on a substrate (S100); and a second step of performing a heat treatment for the substrate on which the nickel is deposited in an oxygen atmosphere for a predetermined time to form a nickel oxide film (S200).

In detail, a nickel oxide film for a bolometer manufactured by the method for manufacturing a nickel oxide film for a bolometer in accordance with an embodiment of the present invention includes at least one compound selected from the group consisting of $NiO_x$, $Ni_{1-y}O$, $Ni_2O_3$, $Ni(OH)_2$, and $NiSiO_3$, $NiSiO_4$, where x satisfies $0 \leq x \leq 20$, and y satisfies $0 \leq y \leq 0.95$. Further, the nickel oxide film for a bolometer is a nickel oxide film to which nickel is added, which is applicable to an uncooled infrared detector. In this case, the nickel has a thickness ranging from 10 nm to 200 nm, and is deposited by a method using one of DC sputter, RF sputter, evaporator, and metal-organic chemical vapor deposition (MOCVD). In this case, the DC sputter and the RF sputter use argon (Ar) or nitrogen ($N_2$) plasma. Moreover, a target of the DC sputter, a target of the RF sputter, and a target of the evaporator use nickel (Ni).

For example, a nickel oxide film obtained through heat treatment of nickel metal can be achieved by forming nickel metal using DC sputter or RF sputter and a thermal evaporator (S100), and then oxidizing the nickel metal through a heat treatment in an oxygen atmosphere (S200). In this case, a composition ratio of the nickel oxide film may be controlled by changing a heat treatment time, a heat treatment temperature, and an oxygen partial pressure degree.

Meanwhile, the thickness of the nickel oxide film may ranges from 20 nm to 300 nm. It is preferred that the thickness of the nickel oxide film layer is around 100 nm associated with a performance index of a bolometer. It is preferred that oxygen content x of $NiO_x$ among components of the nickel oxide film ranges from 1 to 20. A reason why the oxygen content x of $NiO_x$ ranges from 1 to 20 is as follows. When the x of $NiO_x$ is 1, the original resistance appears such that the electric resistance is too large. Accordingly, it is not suitable for the bolometer. When the oxygen component x exceeds 20, the electric resistance is too small such that a TCR value is small and the change of a resistance value is unstable, thereby making it not suitable for the bolometer. It is preferred that nickel component y of $Ni_{1-y}O$ ranges from 0 to 0.95. When the y of $Ni_{1-y}O$ is 0, because the electric resistance is too large, it is not suitable as a bolometer material. When the y of $Ni_{1-y}O$ exceeds 0.95, because the electric resistance is too small, it is not suitable as the bolometer material.

In a case of forming the nickel oxide film through the heat treatment after deposition of the nickel, it is preferred that a heat treatment temperature ranges from 300° C. to 450° C. If the heat treatment temperature is less than 300° C., the oxidation of nickel tends to be very slow and an oxide, specifically an oxide film, can only be obtained through application of a heat treatment for a significantly long time, making the temperature range inappropriate. Meanwhile, if the heat treatment temperature exceeds 450° C., the oxidation may be performed relatively fast and a material for the bolometer may be manufactured, but the temperature range is not suitable for a silicon process.

Figure 5:
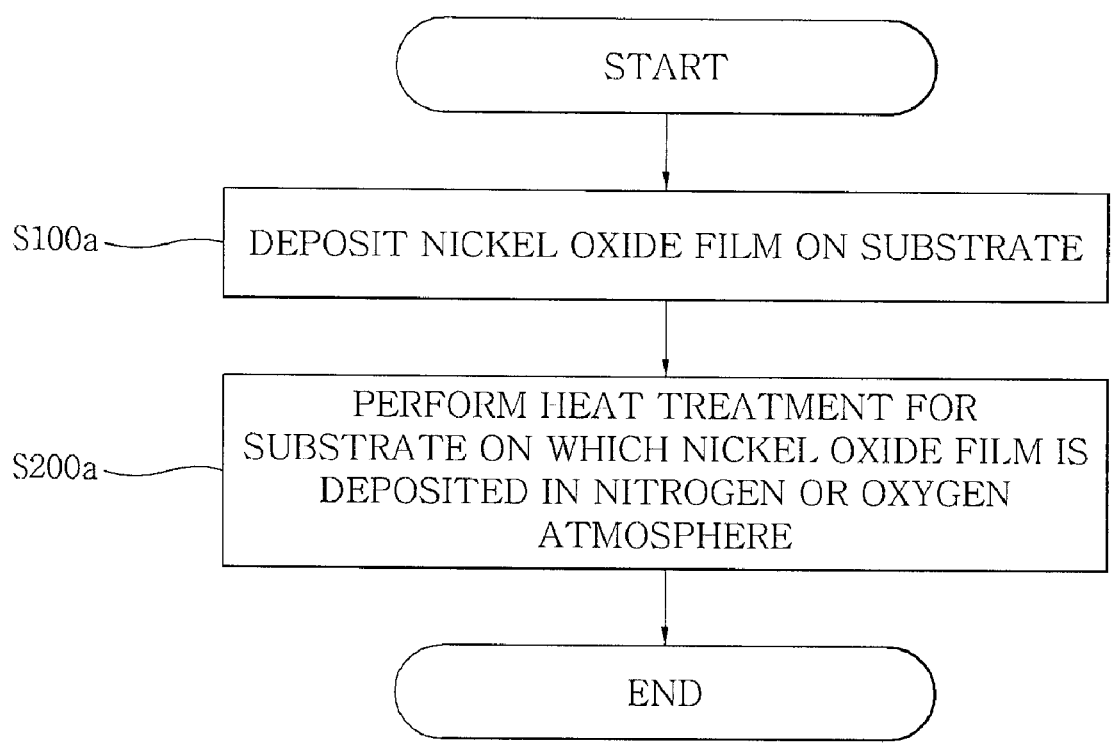
FIG. 5 is a flowchart illustrating a method for manufacturing a nickel oxide film for a bolometer in accordance with another embodiment of the present invention.

FIG. 5 is a flow chart illustrating a method for manufacturing a nickel oxide film for a bolometer in accordance with another embodiment of the present invention.

Figure 6:
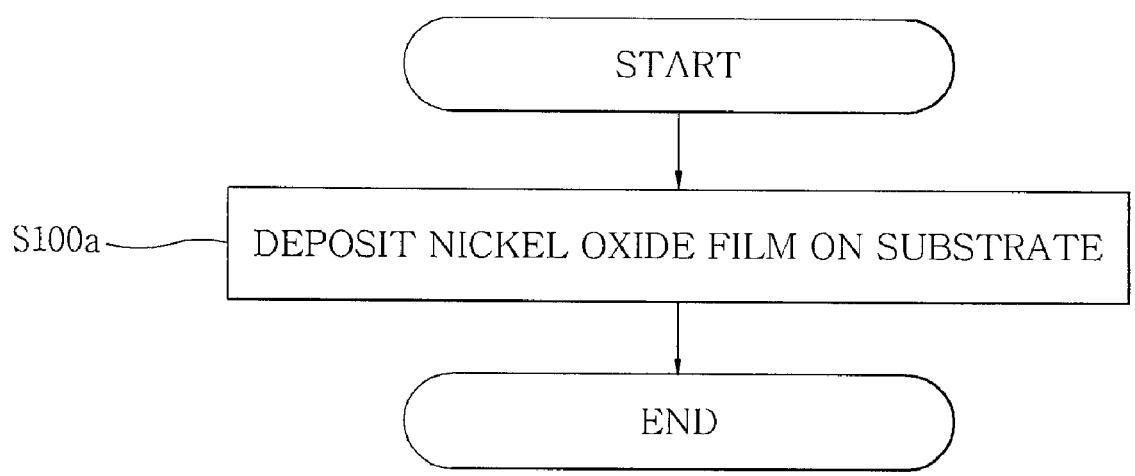
FIG. 6 is a flow chart illustrating a method for manufacturing a nickel oxide film for a bolometer in accordance with the other embodiment of the present invention.

Referring to FIG. 5, the method for manufacturing a nickel oxide film for a bolometer in accordance with another embodiment of the present invention includes: a first step of depositing a nickel oxide film on a substrate (S100*a*); and a second step of performing a heat treatment for the substrate on which the nickel oxide film is deposited in a nitrogen atmosphere or an oxygen atmosphere for a predetermined time (S200*a*). Also, Referring to FIG. 6, the method for manufacturing a nickel oxide film for a bolometer in accordance with the other embodiment of the present invention may include only the step of depositing a nickel oxide film on a substrate (S100*a'*).

In detail, the nickel oxide film for a bolometer manufactured by the method for manufacturing a nickel oxide film for a bolometer in accordance with an embodiment of the present invention includes at least one compound selected from the group consisting of $NiO_x$, $Ni_{1-y}O$, $Ni_2O_3$, $Ni(OH)_2$, $NiSiO_3$, $NiSiO_4$, where x satisfies $1 \leq x \leq 20$, and y satisfies $0 \leq y \leq 0.95$. Here, the nickel oxide film is deposited on the substrate to have a thickness in the range of 20 nm to 300 nm by using one of DC sputter, RF sputter, evaporator, and MOCVD (S100*a*). For example, in a case of the RF sputter (namely, alternating current sputter), nickel metal or a nickel oxide film is used as a target thereof, and argon (Ar), nitrogen ($N_2$), and oxygen ($O_2$) are used as reactive gas.

In this case, so as to make the nickel oxide film, a method for sputtering the nickel metal or the nickel oxide film by producing nitrogen ($N_2$), argon (Ar), or oxygen ($O_2$) plasma, nitrogen ($N_2$)-oxygen ($O_2$) mixing plasma, or argon (Ar)-oxygen ($O_2$) mixing plasma, is used. At this time, the composition ratio of the nickel oxide film may be variously varied when sputter power, a process pressure, a ratio of used gases, and a substrate temperature are changed.

The nickel oxide film being made after performing the step can be used as an infrared sensing material. Depending upon the circumstances, a subsequent heat treatment may be performed in addition to the step.

A heat treatment for the nickel oxide film is performed in a nitrogen atmosphere or an oxygen atmosphere for several minutes to several hours to be crystallized (S200*a*). In this case, the composition ratio of the nickel oxide film can vary according to a nitrogen atmosphere degree, an oxygen atmosphere degree, a heat treatment time, or a heat treatment temperature. That is, after deposition of the nickel oxide film, a heat treatment thereof is performed in a range of 50° C. to 450° C. to crystallize the nickel oxide film. A thickness of the nickel oxide film and a heat treatment temperature has been provided above in the description of FIG. 1, and thus the detailed description thereof is appropriately omitted.

Properties of the nickel oxide film for a bolometer manufactured by the method for manufacturing a nickel oxide film for a bolometer in accordance with an embodiment of the present invention are explained with reference to FIG. 2 through FIG. 4.

Figure 2:
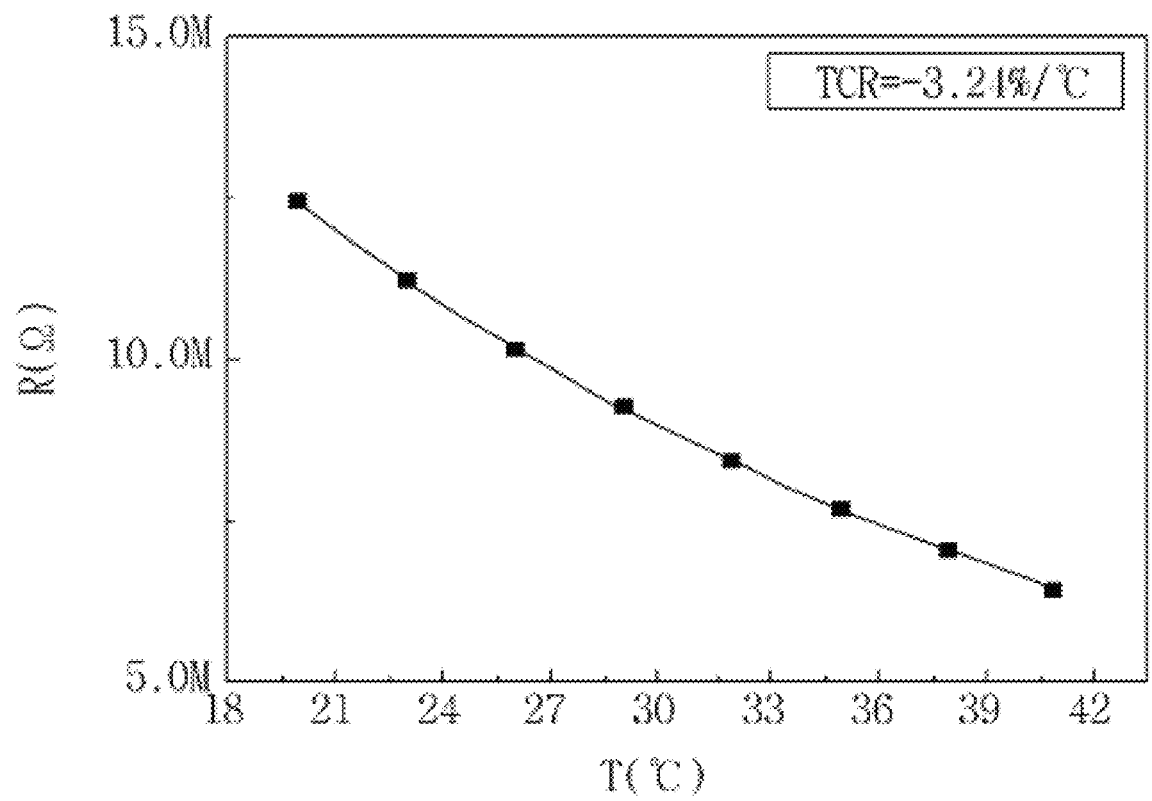
FIG. 2 is a graph illustrating a TCR value which is the change of a resistance value according to a temperature of a nickel oxide film for a bolometer in accordance with an embodiment of the present invention.

FIG. 2 is a graph illustrating a TCR value which is the change of a resistance value according to a temperature of a nickel oxide film for a bolometer in accordance with an embodiment of the present invention. FIG. 3 is a graph illustrating the atmospheric stability as the change of a resistance value according to a temperature of a nickel oxide film for a bolometer in accordance with an embodiment of the present invention. FIG. 4 is a graph illustrating 1/f noise values as noise characteristics according to a frequency of a nickel oxide film for a bolometer in accordance with an embodiment of the present invention.

With reference to FIG. 2, a graph of the TCR value is shown wherein the TCR value is the change of a resistance value according to a temperature of a nickel oxide film. A heat treatment for nickel is conducted in the range of 300° C. to 450° C., such that a TCR value of an oxidized nickel oxide film may obtain a large value of −3.24%/K at room temperature.

Figure 3:
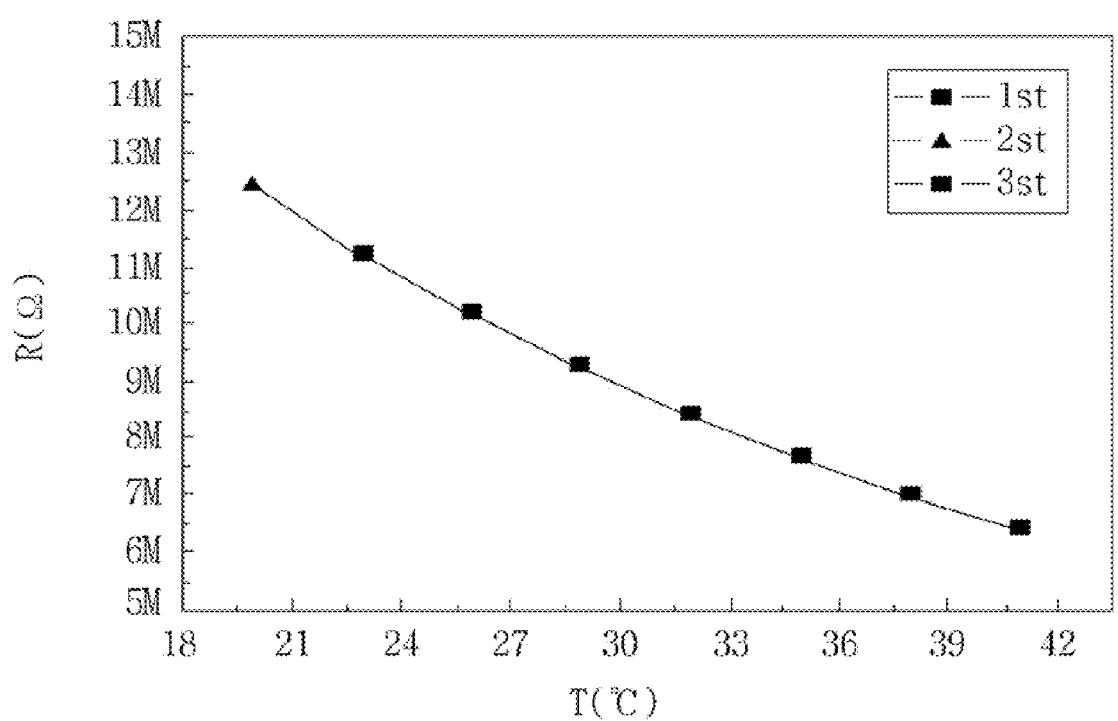
FIG. 3 is a graph illustrating atmospheric stability as the change of a resistance value according to a temperature of a nickel oxide film for a bolometer in accordance with an embodiment of the present invention.

With reference to FIG. 3, a graph of the atmospheric stability is shown as the change of a resistance value according to a temperature of a nickel oxide film for a bolometer in accordance with an embodiment of the present invention. In a case where an unstable material is used in an atmosphere, upon increasing a temperature, the nickel oxide film is oxidized to tend to increase the resistance value. When this procedure is repeated many times at a predetermined temperature range, the nickel oxide film is oxidized during measuring a resistance within an initial temperature range. When a resistance of the nickel oxide film is re-measured within a same temperature range, the resistance value is increased greater than initially measured resistance to raise a graph itself upward.

However, in a case of the nickel oxide film of the present invention shown in FIG. 3, although repeated measurements are performed many times within a constant temperature range, the nickel oxide film continuously has the same resistance value and is present as a relatively stable material in the atmosphere.

Figure 4:
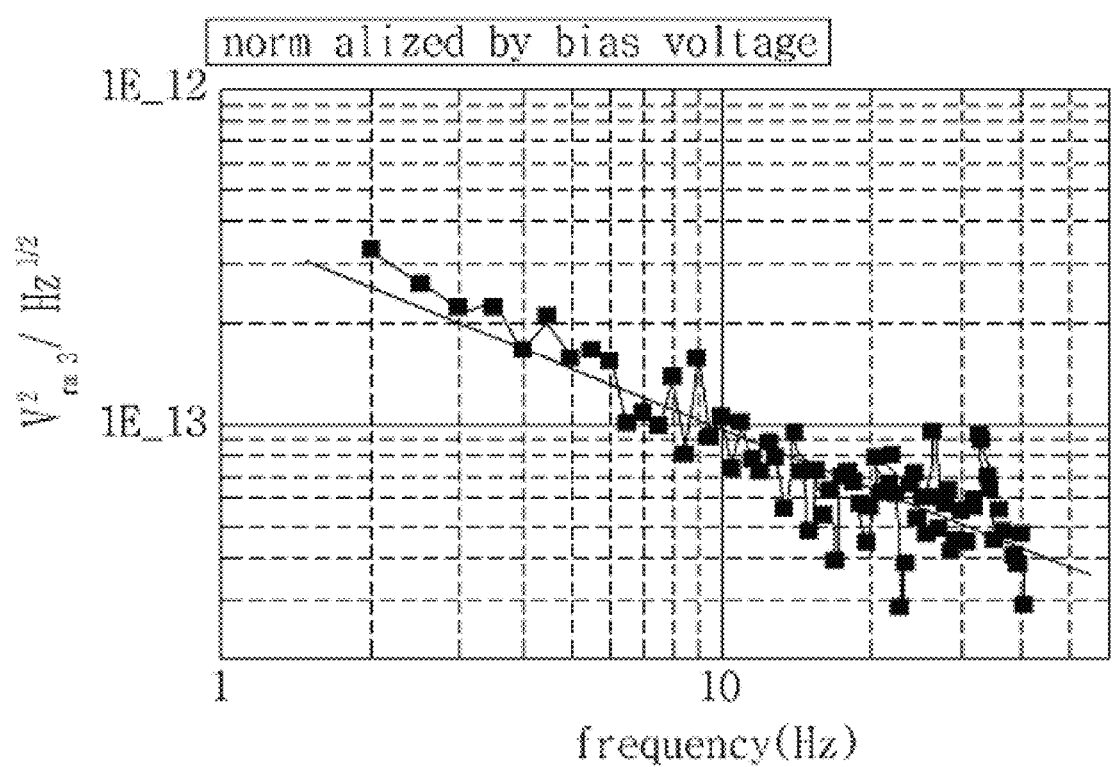
FIG. 4 is a graph illustrating 1/f noise as noise characteristics according to a frequency of a nickel oxide film for a bolometer in accordance with an embodiment of the present invention.

As shown in FIG. 4, it is understood that a noise according to a frequency of the nickel oxide film of a bolometer in accordance with the present invention has a small 1/f noise value of the nickel oxide film.

Since the nickel oxide film for a bolometer produced through the heat treatment with the foregoing properties has a thickness in the range of 20 nm to 300 nm, and a heat treatment for the nickel oxide film is conducted at a temperature ranging from 300° C. to 450° C. in an oxygen atmosphere for several tens to several hours, it can be readily manufactured at low cost. Further, the nickel oxide film for a bolometer may be manufactured as an excellent infrared sensing material for a bolometer with a TCR value exceeding −3%/° C. and a low noise property.

Moreover, the nickel oxide film of the present invention manufactured by the foregoing process is applied to a bolometer being an uncooled infrared detector such that the nickel oxide film can be used as infrared sensing material and the bolometer can be used as a converter sensing an infrared radiation and converting the sensed infrared radiation into an electrical signal. Moreover, the nickel oxide film of the present invention manufactured by the foregoing process is applied to a bolometer or a micro-bolometer being an uncooled infrared detector such that a bolometer or a micro-bolometer with high sensitivity can be manufactured. In this case, because the nickel oxide film being a metal oxide as an infrared sensing material may be manufactured by depositing nickel on a substrate and performing a heat treatment at a temperature ranging from 300° C. to 450° C. in an oxygen atmosphere, it is applicable to a CMOS semiconductor process. In this case, by adjusting a heat treatment temperature, a heat treatment time, and an oxygen atmosphere at the time of the heat treatment, properties of the nickel oxide film may be controlled. As a result, a TCR value around −3%/° C. or more can be obtained.

In addition, although not shown, a nickel oxide film according to another embodiment of the present invention can be manufactured by a film with a low noise, and stability and reproducibility and by depositing without heat treatment at room temperature. The nickel oxide film is applicable to an infrared detector having high infrared ray sensitivity using a nickel oxide film.

Although embodiments in accordance with the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims.

What is claimed is:

1. An infrared detector comprising:
a bolometer comprising a film consisting of $NiO_x$, $Ni_{1-y}O$, $Ni_2O_3$, $Ni(OH)_2$, $NiSiO_3$, or $NiSiO_4$, wherein x satisfies $1 \leq x \leq 20$, and y satisfies $0 \leq y \leq 0.95$.

2. An infrared detector comprising:
a bolometer, wherein the bolometer includes a nickel oxide film that comprises at least one compound selected from the group consisting of $Ni_2O_3$, $Ni(OH)_2$, $NiSiO_3$, and $NiSiO_4$.

3. The infrared detector according to claim 2, wherein the nickel oxide film has a thickness ranging from 20 nm to 300 nm.

* * * * *